(12) United States Patent  
Sakai et al.

(10) Patent No.: US 7,185,422 B2
(45) Date of Patent: Mar. 6, 2007

(54) PART MOUNTING APPARATUS AND PART MOUNTING METHOD

(75) Inventors: Kazunobu Sakai, Nakakoma-gun (JP); Makoto Nakashima, Kofu (JP); Wataru Hirai, Nakakoma-gun (JP); Yasuyuki Ishitani, Nakakoma-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 77 days.

(21) Appl. No.: 10/501,218

(22) PCT Filed: Sep. 20, 2002

(86) PCT No.: PCT/JP02/09660

§ 371 (c)(1),
(2), (4) Date: Jul. 12, 2004

(87) PCT Pub. No.: WO2004/028228

PCT Pub. Date: Apr. 1, 2004

(65) Prior Publication Data

US 2005/0060883 A1 Mar. 24, 2005

(51) Int. Cl.
*H05K 3/30* (2006.01)
*B23P 19/00* (2006.01)

(52) U.S. Cl. .............................. 29/832; 29/739; 29/740; 29/741; 29/743; 29/840; 198/471.1; 198/574; 198/576

(58) Field of Classification Search .................. 29/739, 29/740, 741, 743, 832, 840; 198/471.1, 574, 198/576
See application file for complete search history.

(56) References Cited

U.S. PATENT DOCUMENTS

| 4,794,689 | A | * | 1/1989 | Seno et al. ..................... 29/740 |
| 4,815,913 | A | * | 3/1989 | Hata et al. ...................... 29/729 |
| 4,914,808 | A | * | 4/1990 | Okumura et al. .............. 29/740 |
| 5,033,185 | A | * | 7/1991 | Hidese ........................... 29/740 |
| 5,498,942 | A | * | 3/1996 | Ijuin ........................... 318/567 |
| 5,628,107 | A | * | 5/1997 | Nushiyama et al. ........... 29/740 |
| 5,926,950 | A | * | 7/1999 | Asai et al. ..................... 29/832 |
| 6,088,911 | A | * | 7/2000 | Isogai et al. ................... 29/740 |
| 6,718,626 | B2 | * | 4/2004 | Kawada ......................... 29/740 |
| 6,739,036 | B2 | * | 5/2004 | Koike et al. ................... 29/743 |

FOREIGN PATENT DOCUMENTS

| EP | 0 312 116 | 4/1989 |
| EP | 1 220 595 A2 | 7/2002 |
| JP | 01047100 | 2/1989 |
| JP | 05041467 | 2/1993 |
| JP | 2000-077897 | 3/2000 |
| JP | 2001-223499 | 8/2001 |
| JP | 2002-368495 | 12/2002 |

* cited by examiner

*Primary Examiner*—Carl J. Arbes
(74) *Attorney, Agent, or Firm*—Wenderoth, Lind & Ponack, L.L.P.

(57) ABSTRACT

A component mounting apparatus and a component mounting method which improve accuracy and a rate of placement of components onto a circuit-formed member. A component sucked by a suction nozzle is recognized at a component recognizing position, a deviation of the component from a normal suction status is determined on the basis of component recognition information obtained from this recognition of the component, and a velocity of conveyance of the component for a period of time following the recognition of the component and preceding placement of the component is controlled on basis of a magnitude of the deviation. By this control, the accuracy and rate of placement of components onto the circuit-formed member can be improved.

20 Claims, 11 Drawing Sheets

PART MOUNTING APPARATUS AND PART MOUNTING METHOD

TECHNICAL FIELD

The present invention relates to a component mounting apparatus and a component mounting method for mounting components stably on a circuit-formed member such as a resin boards or the like, and particularly relates to a component mounting apparatus and a component mounting method in which the components are sucked by suction nozzles to be held and conveyed.

BACKGROUND ART

In a component mounting apparatus for mounting components on a circuit-formed member such as a resin boards or the like, it is important to recognize a component and to determine a correction quantity with respect to a placing position on the circuit-formed member for placement of the component onto the circuit-formed member on basis of a result of this recognition before the placement of the component on the circuit-formed member, in order to improve an accuracy of placement and a rate of placement in placement of components.

FIG. 10 shows a conventional component mounting apparatus 100 for mounting components 1 onto a resin board 2 as an example of a circuit-formed member. The resin board 2 is a printed board on which a circuit pattern has been formed for mounting of components 1 that are electronic components, and the resin board 2 is held on an XY-table 8. Parts cassettes 4 provided in a component feeding device 3 contain the components 1 by taping, and the components 1 are sucked one by one at a component sucking position 9 from the parts cassettes 4 by suction nozzles 5 provided on a nozzle unit 6 that makes a unidirectional intermittent rotational motion clockwise in FIG. 10 along an annular path 12.

After a suction operation at the component sucking position 9, the nozzle unit 6 moves along the path 12 to a component recognizing position 10, and suction status of the components 1 sucked on the suction nozzles 5 of the nozzle unit 6 are recognized in a predetermined space by a component recognizing device 7. A control device 20, into which information obtained from the component recognizing device 7 on recognition of the components 1 has been inputted, calculates correction quantities for the placement on basis of this component recognition information and stores the correction quantities in a correction quantity storage section 20c. After this recognition of the components 1, the nozzle unit 6 moves along the path 12 to a component placing position 11.

The control device 20 then calculates coordinates of a placing position on the resin board 2 on basis of coordinates on the resin board 2 registered in NC data read from an NC data storage section 20a and on basis of a corresponding correction quantity stored in the correction quantity storage section 20c, and calculates a turning angle of this suction nozzle 5 for angle correction on basis of the correction quantity. The control device 20 turns the suction nozzle 5 about a central axis thereof on basis of this calculated turning angle, and actuates the XY-table 8 to move the resin board 2 on basis of the calculated coordinates of the placing position on the resin board 2. When the nozzle unit 6 is positioned at the component placing position 11, the components 1 sucked by the suction nozzles 5 of the nozzle unit 6 are placed on the resin board 2.

FIG. 11 shows a deviation $\Delta L$ and an inclination $\Delta \theta$ relative to a normal suction status 1b of a component 1 sucked by a suction nozzle 5. The normal suction status 1b of the component 1 refers to status in which a center of gravity 1a of the component 1 coincides with a central axis 5b of the suction nozzle 5 as shown by broken lines in FIG. 11. In the component mounting apparatus 100, as described above, the components 1 are held with suction by the suction nozzles 5 and are placed onto the resin board 2. In a suction operation shown in FIG. 10 at the component sucking position 9, a deviation of a component 1 by the deviation $\Delta L$ may be caused as shown in FIG. 11 by a positional variation of the components 1 in cavities of a tape provided in the parts cassettes 4, a variation in status of attachment of the suction nozzles 5 in the component mounting apparatus 100, or the like.

Even if the center of gravity 1a of a component 1 is not aligned with the central axis 5b of the suction nozzle 5 when the component 1 is sucked by the suction nozzle 5, the component 1 is conveyed at a conveyance velocity that has been set originally, by a nozzle unit 6 that travels along the path 12 shown in FIG. 10. Accordingly, a moment acting on the component 1 increases with the deviation $\Delta L$ shown in FIG. 11 because an inertial force is exerted on the component 1 in accordance with an acceleration in the travel of the nozzle unit 6. As a result, while the nozzle unit 6 travels after the component recognizing device 7 recognizes the components 1, to calculate the correction quantities, until the components 1 are placed at the component placing position 11, moment forces tending to cause the components 1 to deviate from central axes 5b of the suction nozzles 5 act on the components 1, so that the components 1 on lower ends 5a of the suction nozzles 5 may further deviate from the status in the recognition of the components. In the conventional component mounting apparatus 100, therefore, there is a possibility that a position of a component 1 placed onto the resin board 2 may deviate from the placing position on the resin board 2 based on the NC data and the component recognition information on condition that the component 1 is placed on the resin board 2 only with a position correction based on the correction quantity.

Though the above conventional art has been described with reference to component mounting apparatus 100 of rotary type, a change in deviation caused after the recognition of components cannot be corrected even in a component mounting apparatus of XY-robot type in which nozzle units 6 having suction nozzles 5 can be moved freely in an XY-plane.

The present invention has been made for solving the problems described above, and an object of the present invention is to provide a component mounting apparatus and a component mounting method that improve an accuracy and a rate of placement of components onto a circuit-formed member.

SUMMARY OF THE INVENTION

For achievement of the above object, the invention is configured as follows.

In a first aspect of the present invention, there is provided a component mounting apparatus characterized by comprising:

a component conveying device having a suction nozzle for sucking and holding a component to be placed on a circuit-formed member, for conveying the component sucked by the suction nozzle from a component sucking position where the component is sucked by the suction nozzle to a component placing position where the component sucked by the suction nozzle is placed on the circuit-formed member;

a component recognizing device for recognizing the component sucked by the suction nozzle at a component recognizing position existing on a path along which the suction nozzle is moved by the component conveying device from the component sucking position to the component placing position; and a control device for determining a deviation of the component from a normal suction status on the suction nozzle on basis of component recognition information obtained by the component recognizing device, and for controlling a velocity of conveyance of the component by the component conveying device for a period of time following recognition of the component and preceding a placement of the component on basis of a magnitude of the deviation.

The above first aspect may be designed so that control of the velocity of conveyance performed by the control device is a control by which a setting velocity set initially is decreased or retained for a determination of the velocity of conveyance.

The above first aspect may be designed so that the control device determines a force which is caused in the component by conveyance of the component at the setting velocity after the recognition of the component and tends to cause the component to deviate from a suction position of the component on the suction nozzle in the recognition of the component, on basis of the deviation, and controls the velocity of conveyance on basis of a result of comparison between the force tending to cause the component to deviate and a component holding force which the suction nozzle exhibits.

The above first aspect may be designed so that the control device decreases the setting velocity to determine the velocity of conveyance when the deviation found on basis of the component recognition information is larger than a threshold value, which is a magnitude of deviation based on the force tending to cause the component to deviate balanced with the component holding force.

The above first aspect may be designed so that the control device comprises a component information storage section in which information on properties of the component held by the suction nozzle is stored, and controls the velocity of conveyance on basis of a result of comparison between the component holding force and the force tending to cause the component to deviate which is read from the component data storage section and varies with the properties of the component.

The above first aspect may be designed so that the component conveying device comprises a plurality of suction nozzles of different types, and wherein the control device comprises a storage section for a suction nozzle in which information representing a relationship between types of the suction nozzles and the component holding forces is stored, and controls the velocity of conveyance on basis of a result of comparison between the component holding force of the suction nozzle sucking the component recognized by the component recognizing device, the force being read from the storage section for the suction nozzle, and the force tending to cause the component to deviate which acts on the component sucked by the suction nozzle.

In a second aspect of the present invention, there is provided a component mounting method in which a component to be placed on a circuit-formed member is sucked by a suction nozzle, and the component sucked by the suction nozzle is conveyed until being placed on the circuit-formed member, the method characterized by comprising:

recognizing the component sucked by the suction nozzle in a period of time following suction of the component and preceding placement of the component;

determining a deviation of the component from a normal suction status on the suction nozzle on basis of component recognition information obtained by recognition of the component; and controlling a velocity of conveyance of the component for a period of time following the recognition of the component and preceding the placement of the component on basis of a magnitude of the deviation.

The above second aspect may be designed so that the control of the velocity of conveyance is a control by which a setting velocity set initially is decreased or retained for determination of the velocity of conveyance.

The above second aspect may be designed so that the control of the velocity of conveyance based on the deviation is a control in which a force, caused in the component by conveyance at the setting velocity after the recognition of the component and tending to cause the component to deviate from a suction position of the component on the suction nozzle in the recognition of the component, is determined on basis of the deviation, and in which the velocity of conveyance is controlled on basis of a result of comparison between the force tending to cause the component to deviate and a component holding force which the suction nozzle exhibits.

The above second aspect may be designed so that control of the velocity of conveyance based on the deviation is a control in which the setting velocity is decreased for the determination of the velocity of conveyance when the deviation found on basis of the component recognition information is larger than a threshold value, which is a deviation based on the force tending to cause the component to deviate balanced with the component holding force.

The above second aspect may be designed so that the control of the velocity of conveyance based on the deviation is a control in consideration of the force tending to cause the component to deviate which varies with properties of the component.

The above second aspect may be designed so that the control of the velocity of conveyance based on the deviation is a control in consideration of the component holding force which varies with types of suction nozzles sucking components.

In the component mounting apparatus of the first aspect of the invention and the component mounting method of the second aspect of the invention that have been described above, the component sucked by the suction nozzle that travels along the path from the component sucking position to the component placing position is recognized at the component recognizing position on the path, the deviation is determined on basis of component recognition information obtained from recognition of the component, and the velocity of conveyance for the period of time following the recognition of the component and preceding the placement of the component is thereby controlled on basis of an obtained magnitude of the deviation. As a result, the conveyance of the component at the determined velocity of conveyance for the period of time following the recognition of the component and preceding the placement of the component can restrict a further change in the deviation after the recognition of the component and can improve accuracy and a rate of placement of the component onto the circuit-formed member.

Employment of a configuration in which the setting velocity set initially is decreased or retained for the determination of the velocity of conveyance may obviate a necessity of experiment or the like for the determination of the velocity of conveyance and may make it possible to determine the velocity of conveyance more precisely in comparison with, for example, a method in which velocities of conveyance corresponding to deviations are previously determined or the like, that is conceivable as one of methods of determining the velocity of conveyance from the deviation.

By a configuration in which the force acting on the component with the conveyance of the component at the setting velocity after the recognition of the component and tending to cause the component to deviate from the suction position of the component on the suction nozzle in the recognition of the component is determined on basis of the deviation, the velocity of conveyance can be determined on basis of a result of comparison between the force tending to cause the component to deviate and the component holding force that the suction nozzle exhibits. Thus, instability in suction that is caused by excess of the force tending to cause the component to deviate over the component holding force with increase in the deviation can be restricted, and further change in the deviation after the recognition of the component can be restricted.

In a configuration, the deviation of the component on condition that the component holding force is balanced with the force tending to cause the component to deviate may be set as the threshold value, and the velocity of conveyance may be determined by decreasing the setting velocity when a deviation of the component from the normal suction status is larger than the threshold value. This configuration allows omission of determination of the force tending to cause the component to deviate when the deviation is not larger than the threshold value.

By control of the velocity of conveyance on basis of the result of the comparison between the component holding force and the force tending to cause the component to deviate that varies with the properties of the component, the velocity of conveyance can be controlled precisely so as to correspond to a variation in the force tending to cause the component to deviate according to variation in the properties of the component. Thus, accuracy and rate of placement can be improved even on condition that a plurality of components having different masses, volumes, and heights are placed on the circuit-formed member.

In a configuration which has a plurality of suction nozzles of different types and in which magnitudes of the component holding force vary with the types of the suction nozzles, the velocity of conveyance can be controlled on basis of a result of comparison between the component holding force that varies with the types of the suction nozzles and the force tending to cause the component to deviate. Thus, accuracy and rate of placement of the components onto the circuit-formed member can be improved.

BRIEF DESCRIPTION OF THE DRAWINGS

These and other objects and features of the invention will be apparent from the following description concerning preferred embodiments with reference to the accompanying drawings, in which.

DETAILED DESCRIPTION OF THE PREFERRED EMBODIMENTS

Figure 1:
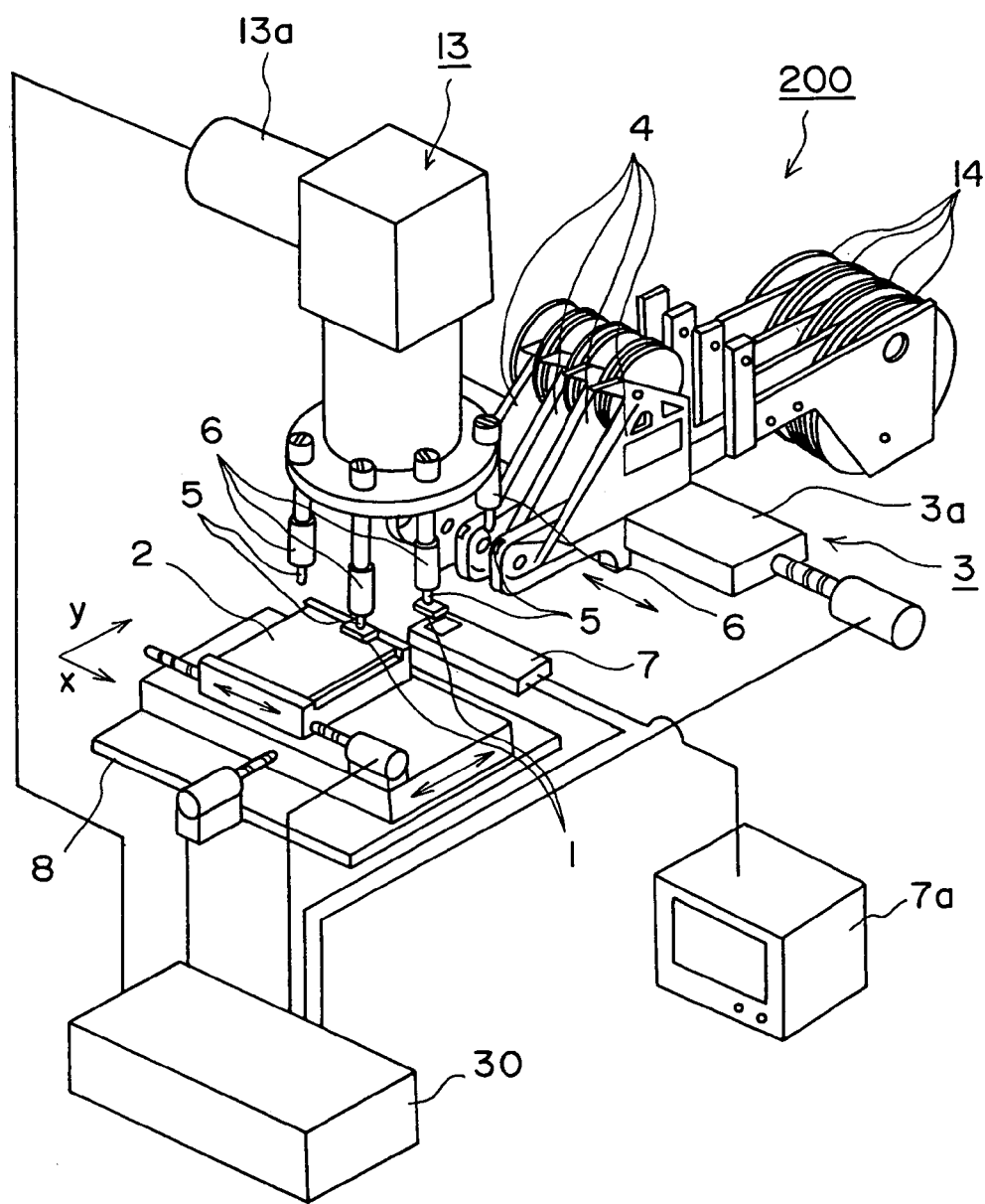
FIG. 1 is a perspective view of a component mounting apparatus in accordance with a first embodiment of the present invention.

Herein below, a component mounting apparatus and a component mounting method that are a first embodiment of the present invention will be described in detail with reference to drawings.

In the component mounting apparatus and the component mounting method, components such as electronic components, machine parts, optical components or the like are mounted on a circuit-formed member such as a circuit board including a resin board, paper-phenol board, ceramic board, glass-epoxy board, film substrate or the like, a circuit boards including a single-layer board and multilayer board, a component, enclosure, and frame. In the drawings, the same members are designated by the same reference characters. In the component mounting apparatus and the component mounting method, components are held with suction by suction nozzles and, as shown by broken lines in FIG. 11, status 1*b* in which a center of gravity 1*a* of a component 1 coincides with a central axis 5*b* of a suction nozzle 5 is defined as a normal suction status of the component 1.

Figure 2:
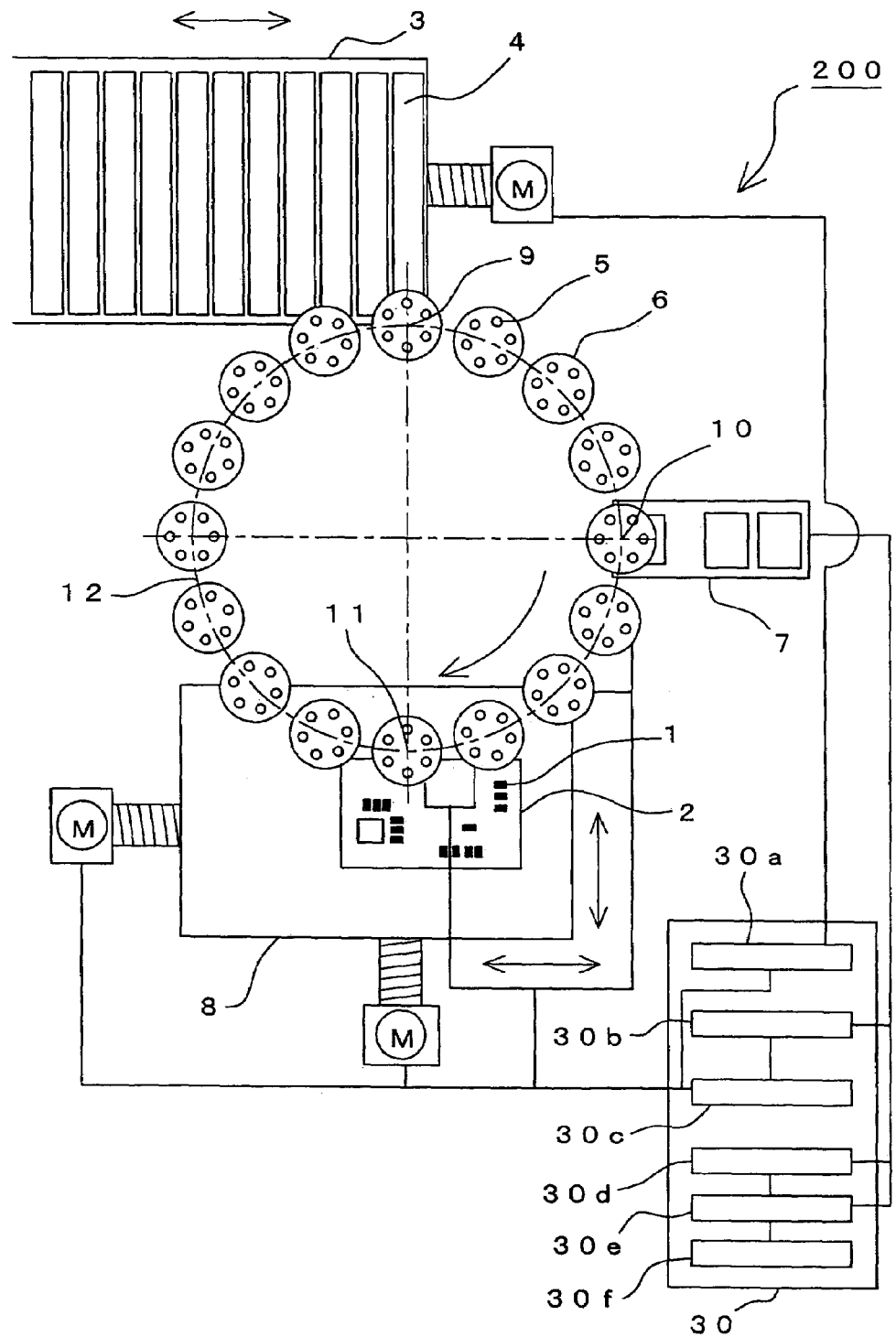
FIG. 2 is an explanatory view illustrating connection of a control device in the component mounting apparatus shown in FIG. 1.

FIG. 1 is a perspective view illustrating an overall configuration of a component mounting apparatus 200 in accordance with the first embodiment of the present invention, and FIG. 2 shows connection of a control device 30 in the component mounting apparatus 200.

As shown in FIG. 2, the component mounting apparatus 200 is a rotary type component mounting apparatus having sixteen nozzle units 6 that are provided with suction nozzles 5 and that are arranged at uniform intervals along an annular path 12. As shown in FIG. 1, the component mounting apparatus 200 has a component conveying device 13, a component feeding device 3, a component recognizing device 7, and an XY-table 8. The component conveying device 13, the component feeding device 3, the component recognizing device 7, and the XY-table 8 are connected respectively to the control device 30.

The component conveying device 13 has the nozzle units 6 and is operated under control of the control device 30 so as to cause the nozzle units 6 to make a unidirectional intermittent rotational motion clockwise along the path 12 shown in FIG. 2. Thus, components 1 sucked by the suction nozzles 5 are conveyed with the unidirectional intermittent rotational motion of the nozzle units 6. An angle of rotation of the unidirectional intermittent rotational motion is 22.5°. The suction nozzle 5 can be turned about central axis 5b shown in FIG. 11, and this turning is controlled by the control device 30.

The component feeding device 3 is provided under the nozzle units 6 as shown in FIG. 1 at a component sucking position 9 on the path 12 shown in FIG. 2. The component recognizing device 7 is provided under the nozzle units 6 as shown in FIG. 1 at a component recognizing position 10 on the path 12 shifted clockwise by 90° along the path 12 from the component sucking position 9 shown in FIG. 2. The XY-table 8 is provided under the nozzle units 6 as shown in FIG. 1 at a component placing position 11 on the path 12 shifted clockwise by 90° on the path 12 from the component recognizing position 10 shown in FIG. 2. The nozzle units 6 stop at the component sucking position 9, the component recognizing position 10, and the component placing position 11 shown in FIG. 2, during the unidirectional intermittent rotational motion caused by the component conveying device 13.

The component feeding device 3 feeds components 1 that are to be sucked by the suction nozzles 5 positioned at the component sucking position 9, and has a component feeding table 3a capable of reciprocating in directions of X-axis in FIG. 1 under control of the control device 30 and has a plurality of parts cassettes 4 attached onto the component feeding table 3a. Types, shapes, outside dimensions, and the like of the components 1 contained in tapes wound in reels 14 attached to the parts cassettes 4 are different from each other in every parts cassette 4. Thus, selection of the components 1 by the component feeding device 3 is achieved to make the parts cassette 4 that feeds the component 1 to be sucked face a lower end 5a of the suction nozzle 5 provided on the nozzle unit 6 positioned in the component feeding position 9 shown in FIG. 11 by actuating the component feeding table 3a with the control device 30.

Figure 3:
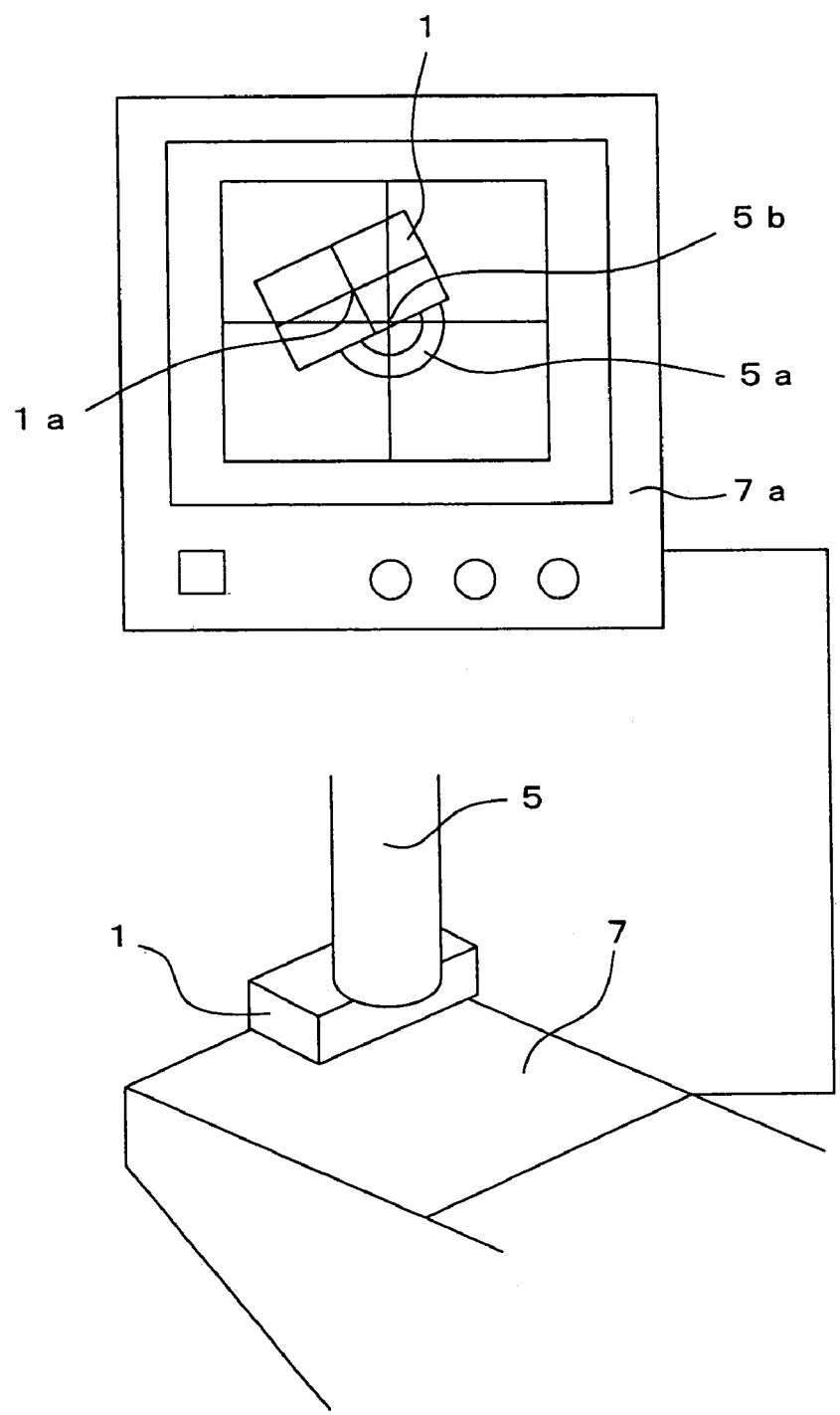
FIG. 3 is a perspective view illustrating recognition of a component by a component recognizing device provided in the component mounting apparatus shown in FIG. 1.
Figure 11:
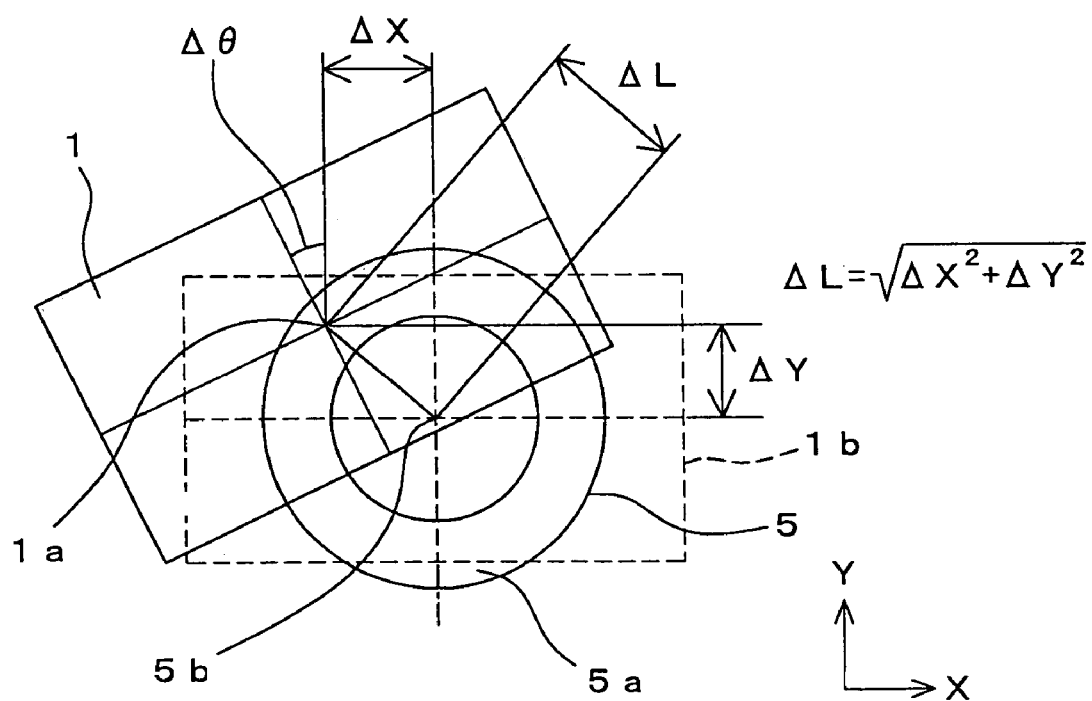
FIG. 11 is an explanatory view illustrating a deviation from a normal suction status and an inclination of a component.

The component recognizing device 7 recognizes positions and status of suction of the components 1, which have been conveyed to the component recognizing position 10, at the suction nozzles 5. This component recognition information of the positions and status of the suction of the components 1 recognized by the component recognizing device 7 is outputted from the component recognizing device 7 to the control device 30 for calculation of correction quantities in placement of the components 1. As shown in FIG. 1, a monitor 7a is connected to the component recognizing device 7. Thus the monitor 7a can display the positions and status of the suction of the components 1 in a predetermined space recognized by the component recognizing device 7 as shown in FIG. 3. A specific factor by which components 1 recognized by the component recognizing device 7 deviate from the normal suction status 1b shown in FIG. 11 is at least one of variation in position in which the component 1 is contained in a cavity of a tape, variation in position of installation of the parts cassette 4 in the component feeding device 3, variation of the parts cassette 4 itself, variation in status of attachment of the suction nozzle 5 in the component mounting apparatus 200, variation in feeding position of the tape in the parts cassette 4, and the like.

The XY-table 8 holds resin board 2 as an example of the circuit-formed member on which the components 1 are to be placed, and is capable of moving the resin board 2 freely in directions of X-axis and of Y-axis in FIG. 1 under control of the control device 30. With movement of the resin board 2 by the XY-table 8, a placing position (not shown) on the resin board 2 on which the component 1 conveyed to the component placing position 11 is to be placed can be placed under the component placing position 11.

As shown in FIG. 2, the control unit 30 has an NC data storage section 30a, a correction quantity calculating section 30b, a correction quantity storage section 30c, a nozzle central axis storage section 30d, a deviation calculating section 30e, and a threshold value storage section 30f.

The NC data storage section 30a stores NC data registering an order in which the components 1 are fed from the component feeding device 3, a setting velocity set for conveyance of the components 1 from the component feeding position 9 to the component placing position 11, and coordinates on the resin board 2 for placement of the components 1 and the like. The correction quantity calculating section 30b calculates a correction quantity for placement of component 1 onto the resin board 2 on basis of the NC data read from the NC data storage section 30a, and position data of the center of gravity 1a of the component 1 shown in FIG. 11 and angle data of an inclination $\Delta\theta$ of the component 1 that are obtained on basis of the component recognition information inputted from the component recognizing device 7. In the correction quantity storage section 30c is temporarily stored a correction quantity calculated by the correction quantity calculating section 30b. The control device 30 is capable of positioning the resin board 2 with actuation of the XY-table 8 based on the NC data and the correction quantity read from the correction quantity storage section 30c. The control device 30 is also capable of correcting an angle of the component 1 with turning of the suction nozzle 5 about the central axis 5a in FIG. 11 based on the correction quantity read from the correction quantity storage section 30c.

In the nozzle central axis storage section 30d shown in FIG. 2 is stored a position of the central axis 5b shown in FIG. 11 of the suction nozzle 5 in the predetermined space, which position is recognized by the component recognizing device 7 shown in FIG. 3. The position data of the central axis 5b of the suction nozzle 5 is obtained by recognizing a suction nozzle 5 that has not sucked the component 1, by the component recognizing device 7 shown in FIG. 2.

The deviation calculating section 30e calculates deviation $\Delta L$ shown in FIG. 11, and the deviation $\Delta L$ is calculated on basis of the position data of the central axis 5b read from the nozzle central axis storage section 30d shown in FIG. 2 and the position data of the center of gravity 1a of the component 1 based on the component recognition information.

In the threshold value storage section 30f shown in FIG. 2 is stored a threshold value of the deviation $\Delta L$ shown in FIG. 11. The control device 30 shown in FIG. 2 compares a threshold value read from the threshold value storage section 30f with the deviation $\Delta L$. If the deviation $\Delta L$ is larger than the threshold value as a result of this comparison, the control device 30 determines a velocity of conveyance of the component 1 following the recognition of the component and preceding placement of the component by decreasing a setting velocity set initially, and controls operation of the component conveying device 13 shown in FIG. 1 on basis of this determined velocity of conveyance. Thus, the component conveying device 13 conveys the component 1 at the velocity of conveyance, from the component recognizing position 10 to the component placing position 11. If the deviation ΔL is not larger than the threshold value, the control device 30 determines the setting velocity as the velocity of conveyance following the recognition of the component and preceding the placement of the component, and controls operation of the component conveying device 13 shown in FIG. 1 on basis of the setting velocity, so that the component conveying device 13 conveys the component 1 at the setting velocity from the component recognizing position 10 to the component placing position 11.

Figure 4:
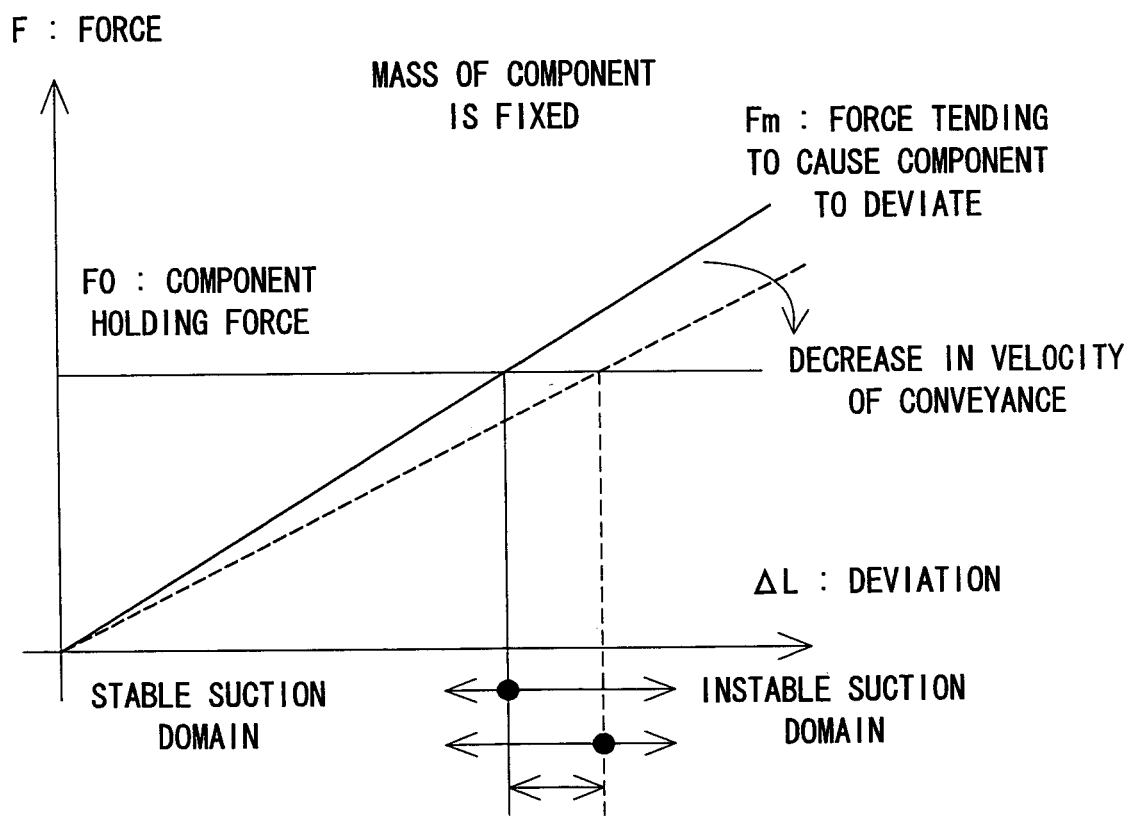
FIG. 4 is a graph representing a relationship between forces tending to cause a component to deviate with respect to a predetermined component holding force and deviations of the component.

FIG. 4 shows a graph representing a relationship between a force Fm, that is caused in the component 1 by conveyance of the component 1 and that tends to cause the component 1 to deviate from a sucking position of the component 1 recognized by the component recognizing device 7, and a component holding force F0 that suction nozzle 5 exhibits. In this figure, a horizontal axis represents the deviation ΔL and a vertical axis represents a force F that acts on the component 1. The component holding force F0 is uniquely determined by a vacuum pressure, an aperture diameter, and the like at the lower end 5a shown in FIG. 11 of the suction nozzle 5. As shown in FIG. 4, the component holding force F0 therefore has a fixed value on condition that a type of the suction nozzle 5 for use is fixed. By contrast, the force Fm that tends to cause the component 1 to deviate is exerted from outside of the component 1 owing to an increase of the velocity of conveyance and the like in a period of time following the recognition of the component and preceding the placement of the component, and the force Fm increases proportionally with the velocity of conveyance. Further, as shown in FIG. 11, the center of gravity 1a of the component 1 deviates from the central axis 5b of the suction nozzle 5 with a larger deviation ΔL. It is therefore thought that the force Fm tending to cause the component 1 to deviate is caused so as to act as a moment with a fulcrum of a center of the lower end 5a of the suction nozzle 5, and is approximately proportional to the deviation ΔL as shown in FIG. 4.

When the deviation ΔL is the same as the threshold value and the velocity of conveyance is equal to the setting velocity, the force Fm tending to cause the component 1 to deviate is balanced with the component holding force F0. That is, the threshold value is a deviation based on the force Fm that tends to cause the component 1 to deviate and that is balanced with the component holding force F0 on condition that the velocity of conveyance is set at the setting velocity. If the deviation ΔL exceeds the threshold value in the component mounting apparatus 200 shown in FIG. 1, accordingly, the force Fm tending to cause the component 1 to deviate exceeds the component holding force F0 on condition that the velocity of conveyance is set at the setting velocity, and thereby causes instable suction by the suction nozzle 5 and further deviation of the component 1 after the recognition of the component.

If the deviation ΔL exceeds the threshold value, the control device 30 decides to obtain the velocity of conveyance for a period of time following the recognition of the component and preceding the placement of the component by decreasing the setting velocity. The following operations are performed for determination of the velocity of conveyance according to this decision. That is, the control device 30 initially calculates the force Fm, tending to cause the component 1 to deviate on condition that the velocity of conveyance is set at the setting velocity, on basis of the deviation ΔL. The control device 30 subsequently compares the force Fm tending to cause the component 1 to deviate of the result of this calculation, with the component holding force F0 which has been set previously. This comparing operation is an operation for finding a difference between the force Fm tending to cause the component 1 to deviate, which force exceeds the component holding force F0, and the component holding force F0 because the threshold value is a value corresponding to a state in which the force Fm tending to cause the component 1 to deviate is balanced with the component holding force F0 as described above. Subsequently, a quantity by which the setting velocity is to be decreased is determined on basis of a result of this comparison, and the velocity of conveyance is thereby determined.

In an example of a method for determining the velocity of conveyance, the quantity by which the setting velocity is to be decreased is increased with increase in the difference between the deviation ΔL and the threshold value when the deviation ΔL is larger than the threshold value, because the force Fm tending to cause the component 1 to deviate increases proportionally with the velocity of conveyance and because the force Fm tending to cause the component 1 to deviate is approximately proportional to the deviation ΔL. In the embodiment, the quantity to be decreased from the setting velocity is obtained by result of comparison, and then the velocity of conveyance is determined by subtracting the quantity to be decreased from the setting velocity. The force Fm tending to cause the component 1 to deviate can be restricted by conveyance of the component 1 at the determined velocity of conveyance. As a result, a further change in the deviation ΔL after the recognition of the component can be restricted. Thus, accuracy and rate of placement of the component 1 on the resin board 2 can be improved. Since the velocity of conveyance is determined by the result of the comparison, the velocity of conveyance is the highest of velocities that can restrict a further change in the deviation ΔL.

In the embodiment, the quantity to be decreased is changed proportionally with the difference between the deviation ΔL and the threshold value when the deviation ΔL is larger than the threshold value; in a first modification of the embodiment, however, the quantity to be decreased may previously be set at a fixed value and the velocity of conveyance may be determined by subtraction of the fixed value from the setting velocity when the deviation ΔL is larger than the threshold value. The fixed value is a value that is subtracted from the setting velocity and that, for example, can obtain a velocity of conveyance preventing a further change in the deviation ΔL in the conveyance of any component 1 from the setting velocity. The fixed value is one value regardless of magnitudes of the difference between the deviation ΔL and the threshold value. In the modification, it is necessary to determine the fixed value previously by experiments or the like and to set this determined fixed value as one item of the NC data; however, arithmetic processing for determining the velocity of conveyance in the control device 30 in the modification is easier to perform than in the embodiment because the modification does not require operation of a comparison between the component holding force F0 and the force Fm tending to cause the component 1 to deviate.

The method of controlling the velocity of conveyance for the period of time following the recognition of the component and preceding the placement of the component is not limited to the method in which the velocity of conveyance is controlled by the decrease from the setting velocity set initially when the deviation ΔL is larger than the threshold value. That is, in a second modification of the embodiment, that is different from the method described above of the embodiment and from the first modification, corresponding velocities according to magnitudes of the deviation ΔL may previously be set as one item of the NC data, a corresponding velocity corresponding to the deviation ΔL may be introduced on basis of a magnitude of the deviation ΔL of the component 1 recognized by the component recognizing device 7 in the recognition of the component, and the corresponding velocity may be used as the velocity of conveyance for the period of time following the recognition of the component and preceding the placement of the component. In short, each corresponding velocity is equivalent to a proper velocity of conveyance. The corresponding velocity is a velocity that prevents a further change in the deviation ΔL of the component 1 in conveyance following the recognition of the component and preceding the placement of the component. In this modification, it is necessary to determine the corresponding velocity previously by experiments or the like and to set this determined corresponding velocity as one item of the NC data; however, processing for determining the velocity of conveyance in the control device 30 in this modification is easier to perform than in the embodiment described above because this modification does not require operation of a comparison between the component holding force F0 and the force Fm tending to cause the component 1 to deviate, as is the case with the first modification. Besides, the velocity of conveyance can be controlled more precisely than in the first modification because corresponding velocities are set according to individual magnitudes of the deviation ΔL.

The second modification is a method of determining the velocity of conveyance without use of the setting velocity as described above and is not a method in which the velocity of conveyance is determined by subtraction as in the embodiment described above. In the case that the velocity of conveyance is determined by the decrease from the setting velocity as in the embodiment described above, the velocity of conveyance can be determined more precisely than in the second modification because the operation of the comparison on basis of the deviation ΔL is performed, and the velocity of conveyance is thus calculated each time the component is recognized by the component recognizing device 7.

After the velocity of conveyance is determined on basis of the result of the comparison between the deviation ΔL and the threshold value, the control device 30 controls the operation of the component conveying device 13. The component conveying device 13 moves the nozzle unit 6 along the path 12 at the determined velocity of conveyance. With this movement of the nozzle unit 6, the component 1 is conveyed from the component recognizing position 10 to the component placing position 11 at the velocity of conveyance determined by the decrease from the setting velocity.

When the control device 30 performs control for decreasing the setting velocity and setting the decreased velocity as the velocity of conveyance, the force Fm tending to cause the component 1 to deviate is decreased for the component holding force F0 as shown in FIG. 4, so that suction of the component 1 by the suction nozzle 5 shown in FIG. 1 is stabilized. This stabilization of the suction of the component 1 by the suction nozzle 5 prevents the deviation ΔL of the component 1 from changing when the component 1 is conveyed after the recognition of the component. As a result, positional correction in positioning of the resin board 2 can be achieved only by the correction quantity and the component 1 can be placed accurately on the resin board 2.

Figure 5:
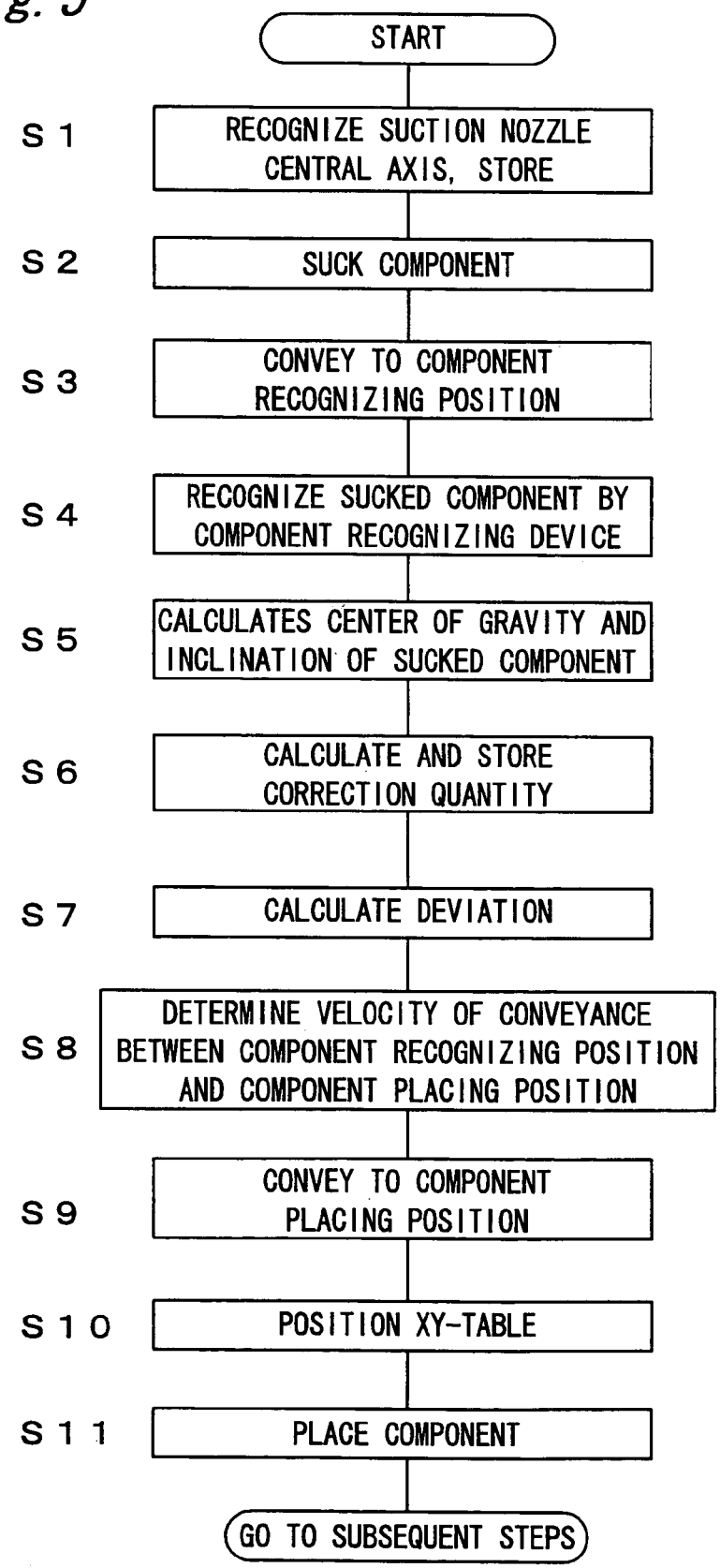
FIG. 5 is a flowchart illustrating a component mounting method in accordance with the first embodiment of the present invention.

Herein below, a component mounting method using the component mounting apparatus 200 will be described. FIG. 5 is a flowchart illustrating a series of mounting operations performed by the component mounting apparatus 200.

In a step (designated as "S" in FIG. 5) 1, initially, the component conveying device 13 is actuated in a status in which all the suction nozzles 5 shown in FIG. 1 are free of suction of components 1, and then positions of central axes 5b shown in FIG. 11 of all the suction nozzles 5 are recognized by the component recognizing device 7. The positions of the central axes 5b shown in FIG. 11, which positions have been recognized by the component recognizing device 7 shown in FIG. 1, are stored as data in the nozzle central axis storage section 30d of the control device 30 shown in FIG. 2.

After completion of recognition of the central axes 5b shown in FIG. 11 of all the suction nozzles 5, as shown in a step 2 shown in FIG. 5, component 1 is sucked by suction nozzle 5 at the component sucking position 9 shown in FIG. 2. The control device 30 actuates the component feeding table 3a on basis of the NC data read from the NC data storage section 30a, and the parts cassette 4 capable of feeding the component 1 specified in the NC data is positioned under nozzle unit 6 positioned at the component sucking position 9. The component 1 is then sucked from the parts cassette 4 by the suction nozzle 5 provided on the nozzle unit 6. The suction nozzle 5 sucks the component 1 with a fixed component holding force for a period of time following suction of the component and preceding placement of the component.

After the suction of the component, as shown in a step 3 shown in FIG. 5, the component 1 is conveyed to the component recognizing position 10 with movement of the nozzle unit 6 shown in FIG. 2.

In the component recognizing position 10, as shown in a step 4 shown in FIG. 5, the component 1 is recognized by the component recognizing device 7 shown in FIG. 1. As shown in a step 5 shown in FIG. 5, subsequently, the control device 30 shown in FIG. 1 calculates a position of a center of gravity 1a of the component 1 shown in FIG. 11 and an inclination Δθ of the component 1 on basis of component recognition information obtained from the recognition performed by recognizing device 7. As shown in a step 6 shown in FIG. 5, the control device 30 shown in FIG. 2 then calculates a correction quantity on basis of positional data of the center of gravity 1a and angle data of the inclination Δθ of the component 1, and stores the correction quantity in the correction quantity storage section 30c shown in FIG. 2.

The correction quantity is thus calculated and, as shown in a step 7 shown in FIG. 5, the control device 30 shown in FIG. 2 then calculates deviation ΔL on basis of positional data of the central axis 5b of the suction nozzle 5 shown in FIG. 11 which data has been read from the nozzle central axis storage section 30d, and the positional data of the center of gravity 1a shown in FIG. 11 of the component 1, which data has been calculated in the step 5 shown in FIG. 5.

As shown in a step 8 shown in FIG. 5, subsequently, the control device 30 shown in FIG. 2 compares a threshold value read from the threshold value storage section 30f with the deviation ΔL, and on basis of a result of this comparison, decides to control a velocity of conveyance of the component 1 for the period of time following the recognition of the component and preceding the placement of the component so as to decrease or maintain a setting velocity. If the deviation ΔL exceeds the threshold value and the control device 30 decides to decrease the velocity of conveyance in comparison with the setting velocity, the control device 30 calculates force Fm tending to cause the component 1 to deviate on condition that the velocity of conveyance is set at the setting velocity, on basis of a magnitude of the deviation ΔL. The control device 30 subsequently compares component holding force F0 of the suction nozzle 5 with the force Fm tending to cause the component 1 to deviate, thereby obtaining a difference between the force Fm tending to cause the component 1 to deviate and the component holding force F0. Then the control device 30 obtains a quantity by which the setting velocity is to be decreased on basis of the difference between the force Fm tending to cause the component 1 to deviate and the component holding force F0, thereby determining the velocity of conveyance of the component 1 for the period of time following the recognition of the component and preceding the placement of the component.

After determining the velocity of conveyance, the control device 30 actuates the component conveying device 13 shown in FIG. 1 so that the velocity of conveyance of component conveying device 13 has a value determined in the step 8 shown in FIG. 5, and the control device 30 moves the nozzle unit 6 at the velocity of conveyance from the component recognizing position 10 along the path 12 shown in FIG. 2. With this movement of the nozzle unit 6, as shown in a step 9 shown in FIG. 5, the component 1 is conveyed to the component placing position 11 shown in FIG. 2. Between the recognition of the component and the placement of the component, the control device 30 causes the suction nozzle 5 to turn about the central axis 5a shown in FIG. 11 on basis of the correction quantity read from the correction quantity storage section 30c, and thus corrects an angle of the component 1.

While the nozzle unit 6 moves from the component recognizing position 10 to the component placing position 11, as shown in a step 10 shown in FIG. 5, the control device 30 shown in FIG. 2 performs positioning of resin board 2 held on the XY-table 8 on basis of NC data read from the NC data storage section 30a and the correction quantity read from the correction quantity storage section 30c.

When the component 1 is disposed at the component placing position 11 after completion of positioning of the resin board 2 and correction of the angle of the component 1, the component 1 is placed on a placing position on the resin board 2 shown in FIG. 1, which position has been registered in the NC data, as shown in a step 11 shown in FIG. 5.

After completion of placement of components 1, the nozzle unit 6 having the suction nozzles 5 is moved by the component conveying device 13 along the path 12 shown in FIG. 2 to the component sucking position 9, and a series of operations from the step 2 to the step 11 shown in FIG. 5 is repeated again.

In the first embodiment, the component mounting apparatus 200 determines the deviation ΔL on basis of the component recognition information on the component 1 obtained by the component recognizing device 7, and determines the velocity of conveyance of the component 1 for the period of time following the recognition of the component and preceding the placement of the component, on basis of the magnitude of the deviation ΔL. As a result, the conveyance of the component 1 at this determined velocity of conveyance prevents the component 1 from further deviating from the status in recognition of the component, in the period of time following the recognition of the component and preceding the placement of the component. By preventing of further deviation of the component 1 in the period of time following the recognition of the component and preceding the placement of the component, a position at which the component 1 is actually placed on the resin board 2 is prevented from deviating from a placing position on the resin board 2, which position is introduced from the NC data and the correction quantity based on component recognition information, when the component 1 is placed on the resin board 2. Thus, the component 1 can be placed on the placing position at all times, and consequently the component mounting apparatus 200 can improve accuracy and a rate of placement of the component 1 on the resin board 2.

Since the velocity of conveyance is controlled on basis of the result of the comparison between the component holding force F0, that the suction nozzle 5 exhibits, and the force Fm tending to cause the component 1 to deviate that is based on the deviation ΔL, this control restricts instability in suction that is caused by excess of the force Fm tending to cause the component 1 to deviate over the component holding force F0.

By setting of the threshold value for the deviation ΔL, a determination of the force Fm tending to cause the component 1 to deviate can be omitted when the force Fm tending to cause the component 1 to deviate is not larger than the component holding force F0.

If it is difficult to calculate the force Fm tending to cause the component 1 to deviate in the first embodiment, a relationship between the setting velocities of the component 1 and the deviations ΔL may be found previously by experiments, and data of the setting velocities found by the experiments may previously be registered so as to be added to the NC data. Thus, the control device 30 is capable of reading the data of the setting velocities and thereby controlling the velocity of conveyance of the component 1 for the period of time following the recognition of the component and preceding the placement of the component.

(Second Embodiment)

In the component mounting apparatus 200 and the component mounting method in accordance with the first embodiment, the velocity of conveyance of the component 1 for the period of time following the recognition of the component and preceding the placement of the component is controlled on basis of a fact that magnitudes of a force tending to cause the component 1 to deviate are approximately proportional to magnitudes of the deviation ΔL shown in FIG. 11.

Figure 6:
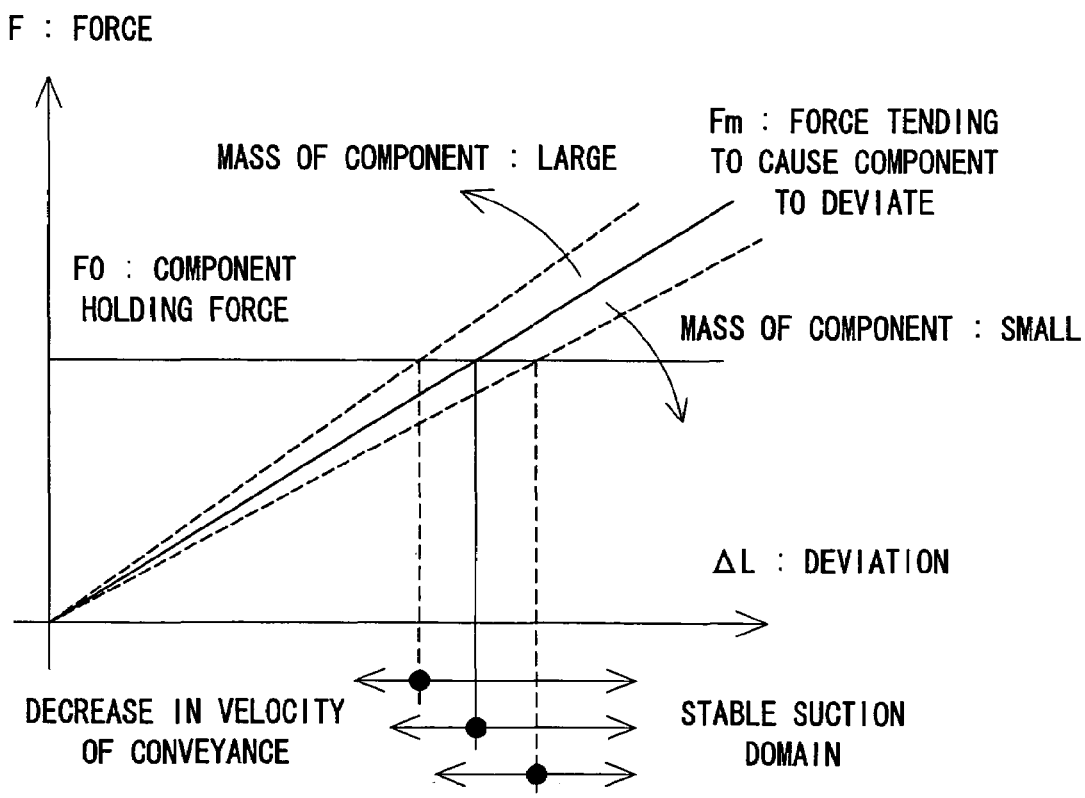
FIG. 6 is a graph representing a relationship between forces tending to cause a component to deviate with respect to a predetermined component holding force and a mass of the component.
Figure 7:
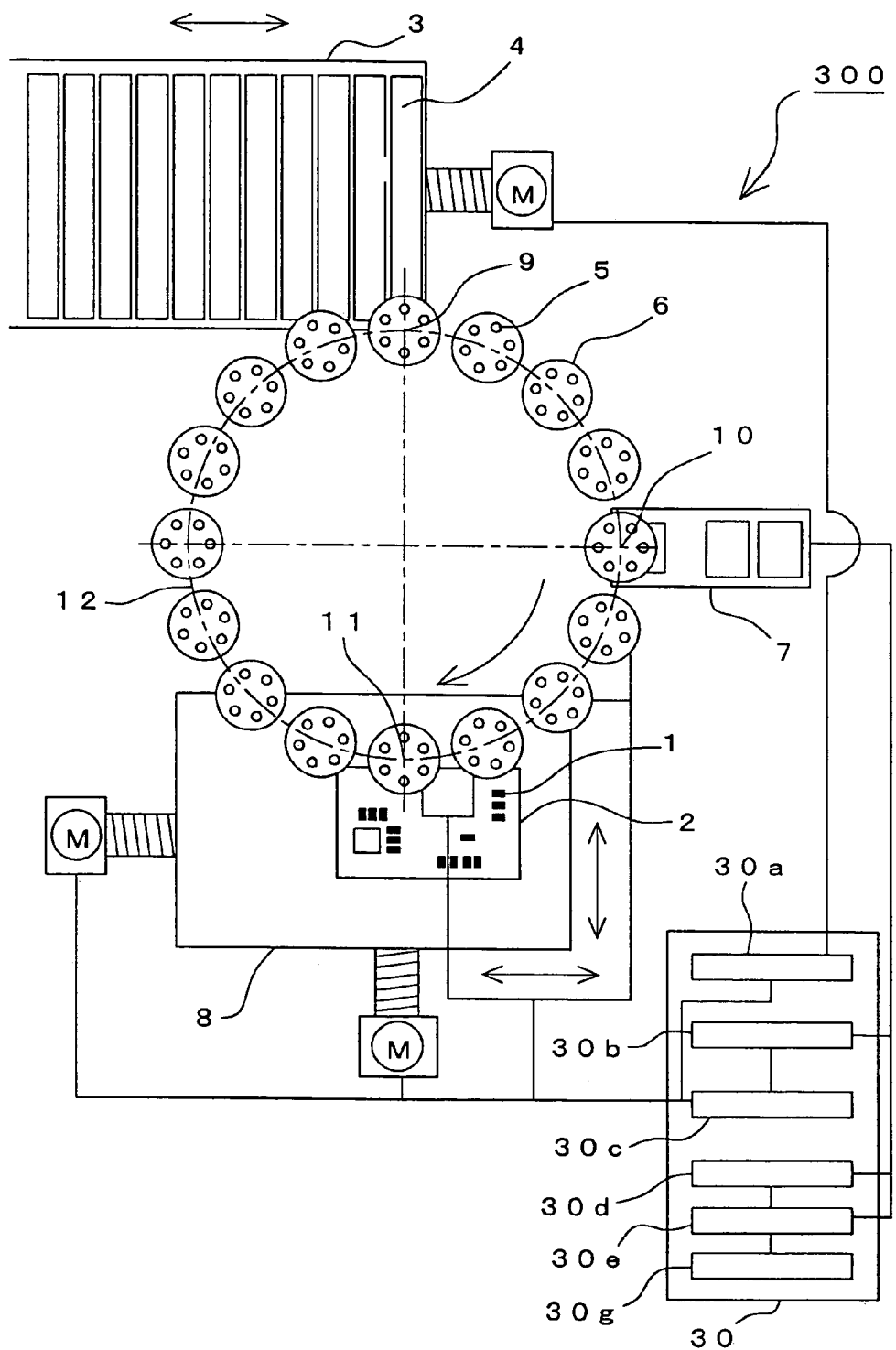
FIG. 7 is an explanatory view illustrating connection of a control device in a component mounting apparatus in accordance with a second embodiment of the present invention.

As shown in FIG. 6, magnitudes of the force Fm tending to cause the component 1 to deviate also vary proportionally with masses of component 1. As shown in FIG. 7, a control device 30 in a component mounting apparatus 300 in accordance with a second embodiment may have a component information storage section 30g in which information on properties such as masses, volumes, and heights of the components 1 is previously registered, so as to be capable of addressing variation in the masses of the components 1. The control device 30 is capable of finding the force Fm tending to cause the component 1 to deviate on basis of the deviation ΔL found by the component recognition information on the component 1 obtained from the component recognizing device 7, and on basis of the information on the properties of the component 1 read from the component information storage section 30g. The control device 30 is capable of controlling the velocity of conveyance for a period of time following recognition of a component and preceding placement of the component, on basis of a result of the comparison between the force Fm tending to cause the component 1 to deviate and the component holding force F0.

In the component mounting apparatus 300 and the component mounting method in accordance with the second embodiment, the velocity of conveyance of the component 1 for the period of time following the recognition of the component and preceding the placement of the component can be controlled further precisely according to the force Fm tending to cause the component 1 to deviate that varies with the properties of the component 1.

If the mass of the component 1 is unknown and cannot be registered in the component information storage section 30g, the mass of the component 1 can be calculated by previous registration of a volume of the component 1 as a property of the component 1 in the component information storage section 30g, and by registration of a density of the component 1, or a tentative mass of the component 1 can be calculated by registration of commonly assumed specific gravities of iron and the like, as an example, in the component information storage section 30g. The velocity of conveyance can be determined on basis of the mass.

In a case that the volume of the component 1 is used, an outside diameter of the component 1 is often registered previously in a component library data for recognition of the component 1, and therefore calculation of the mass of the component 1 with use of the component library data is more convenient than that with further registration of the mass of the component 1 in the component information storage section 30g.

(Third Embodiment)

Figure 8:
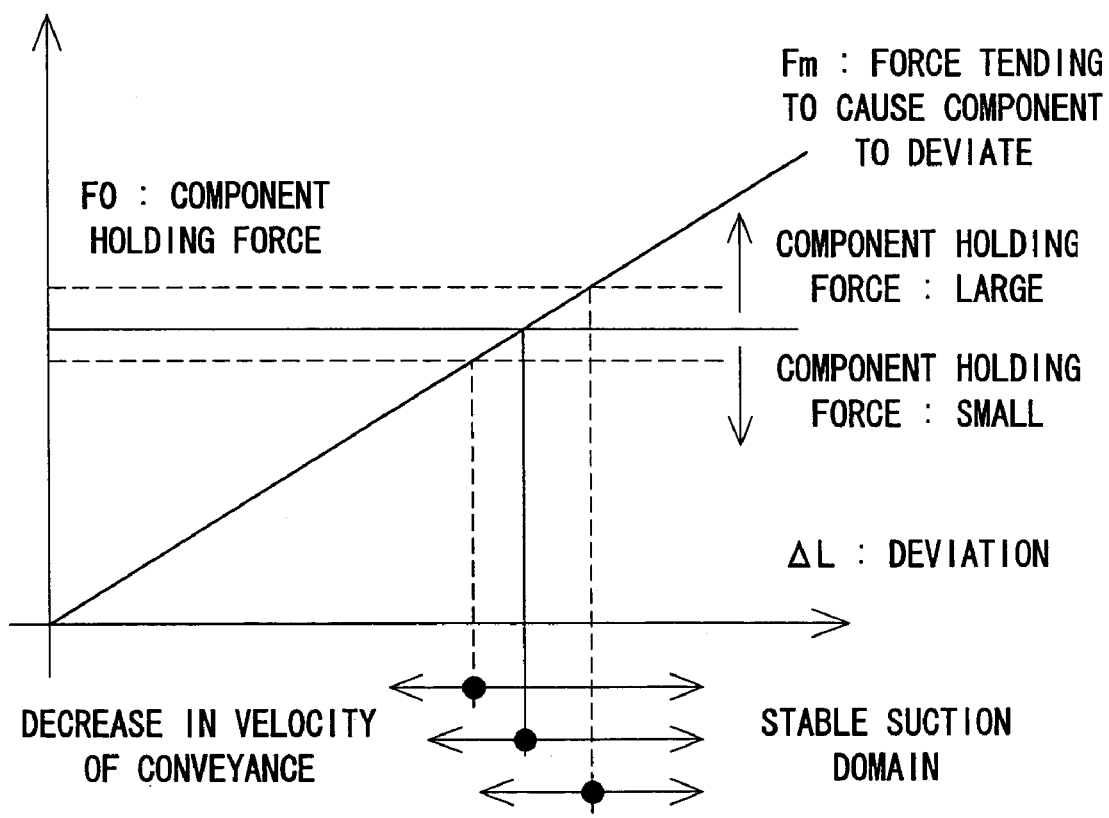
FIG. 8 is a graph representing a relationship between component holding forces that suction nozzles exhibit and forces tending to cause a component to deviate.

The first embodiment and the second embodiment have been described as those in which the suction nozzles 5 have a fixed component holding force. In a configuration having a plurality of types of suction nozzles 5, however, shapes and aperture diameters of the lower ends 5a shown in FIG. 11 of the suction nozzles 5 vary with types of the suction nozzles 5. Suction areas on the components 1 sucked by the suction nozzles 5 vary with the shapes and aperture diameters of the lower ends 5a, and thus component holding forces F0 that the suction nozzles 5 have increase and decrease with variation in the suction areas. As shown in FIG. 8, a stable suction domain of deviation ΔL with respect to component holding force F0 also increases and decreases with an increase and decrease in the component holding force F0. Consequently, it is necessary to control the velocity of conveyance of the component 1 in accordance with this variation in the component holding force.

Figure 9:
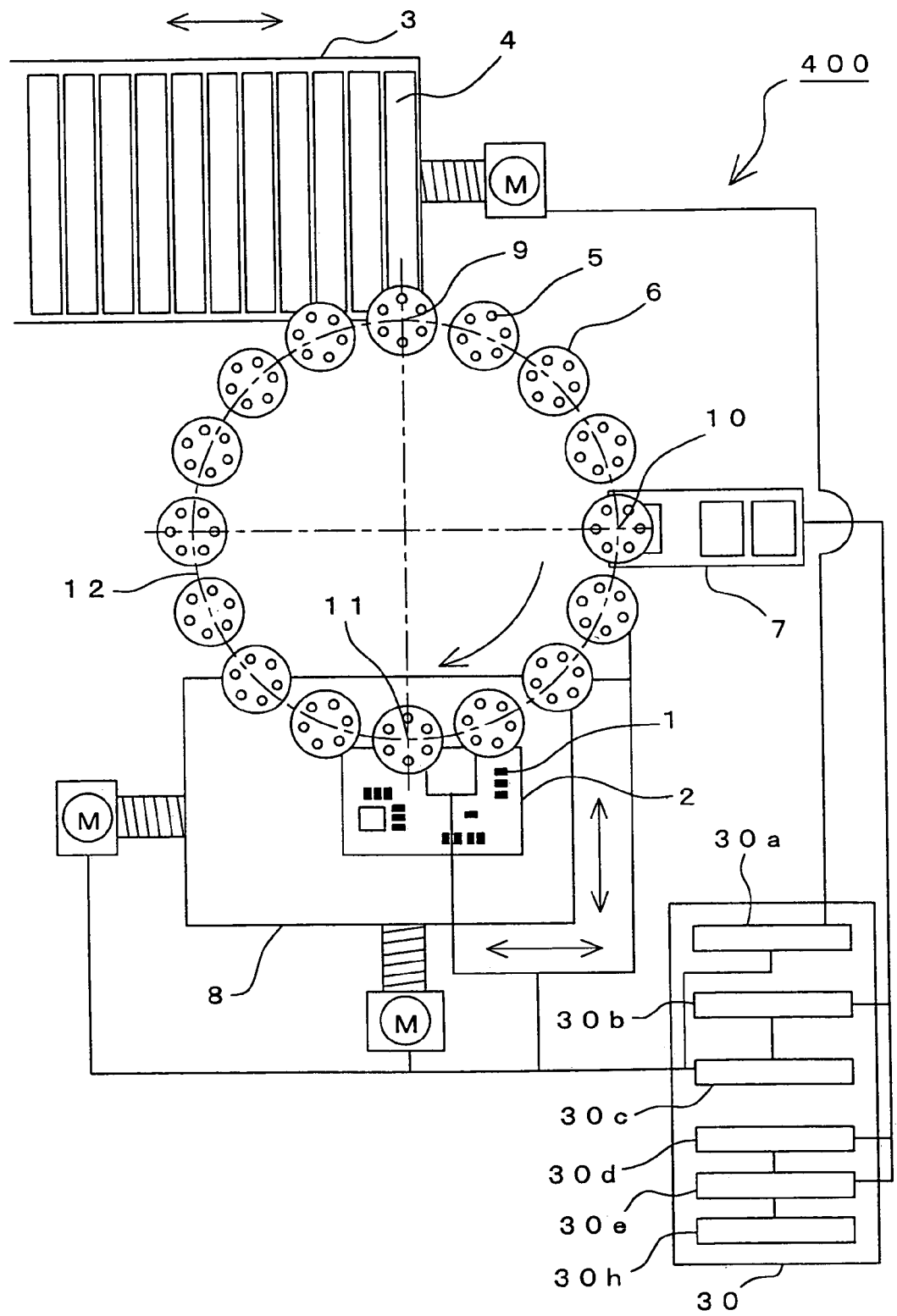
FIG. 9 is an explanatory view illustrating connection of a control device in a component mounting apparatus in accordance with a third embodiment of the present invention.
Figure 10:
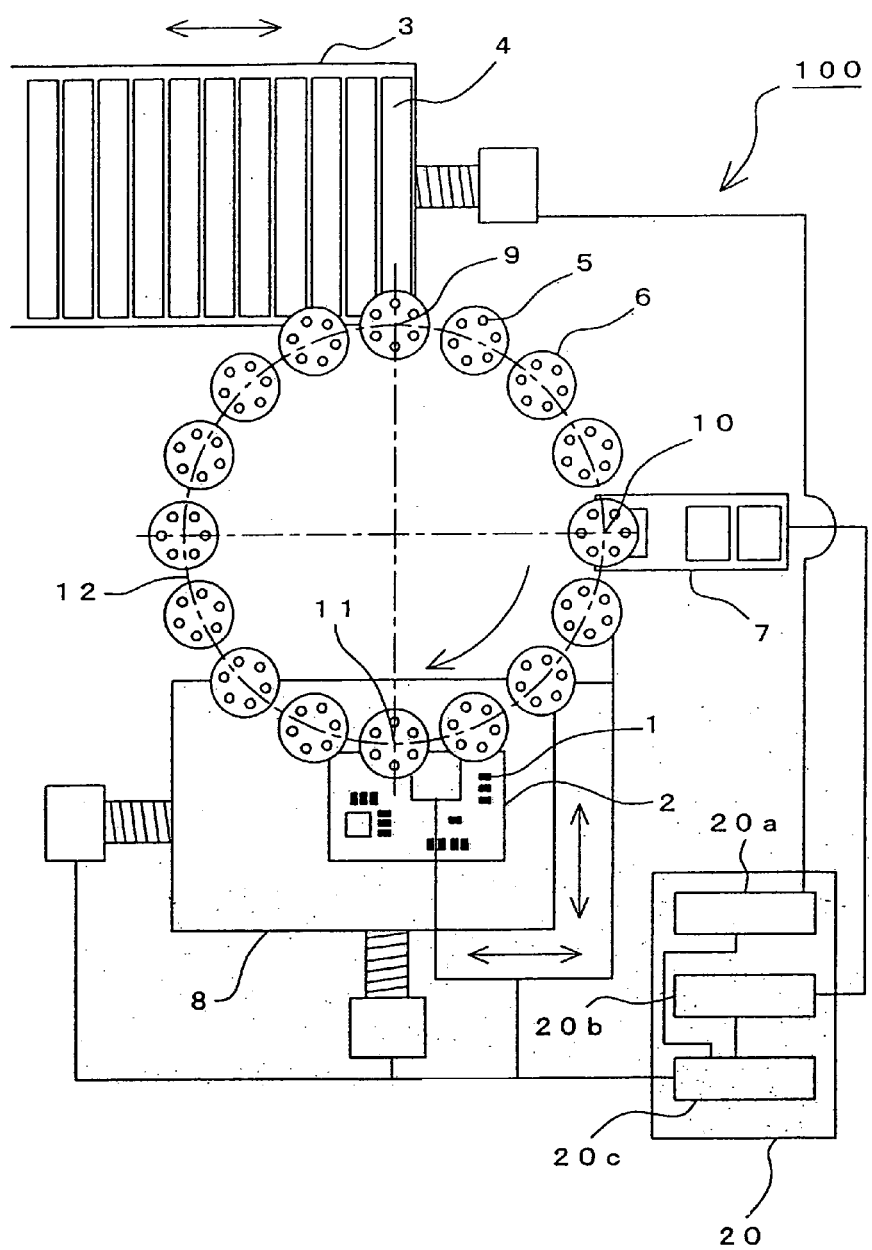
FIG. 10 is an explanatory view illustrating connection of a control device in a conventional component mounting apparatus.

In a component mounting apparatus 400 in accordance with a third embodiment shown in FIG. 9, therefore, a control device 30 may have a storage section 30h for suction nozzles in which information representing a relationship between types of suction nozzles 5 and component holding forces is stored. The control device 30 determines force Fm tending to cause the component 1 to deviate shown in FIG. 8 on basis of the deviation ΔL shown in FIG. 11 which is obtained by component recognition information on the component 1 obtained by the component recognizing device 7, and is capable of controlling the velocity of conveyance for a period of time following recognition of the component and preceding placement of the component on basis of a result of comparison between the force Fm tending to cause the component 1 to deviate and the component holding force F0 according to the suction nozzle 5 sucking the component 1, which component holding force is read from the storage section 30h for suction nozzle shown in FIG. 9.

In the component mounting apparatus 400 and the component mounting method in accordance with the third embodiment, the velocity of conveyance after the recognition of the component can be controlled even though magnitudes of the component holding force F0 vary with types of the suction nozzles 5 that suck the components 1, so that accuracy and a rate of placement of the components 1 on resin board 2 can be improved. Additionally, the component holding force F0 is uniquely determined by the type of the suction nozzle 5, and therefore, more convenient setting is achieved than that with registration of the properties for each component 1 as in the second embodiment.

On condition that the nozzle unit 6 provided in the component mounting apparatus 400 is a multi-nozzle unit having a plurality of suction nozzles 5 of different types which can be selected, a registration number is assigned to each suction nozzle 5 of the nozzle unit 6 and the registration numbers of the suction nozzles 5 are often registered previously in the component library data. Therefore, according to calculation of the component holding force of the suction nozzle 5 by introducing the type of the suction nozzle 5, it is more convenient in comparison with further registration of the component holding force F0 of the suction nozzle 5 in the storage section 30h for the suction nozzle.

It is possible and more preferable to further improve accuracy and rate of the placement with use of the first through third embodiments in combination in comparison with those in each of the first to third embodiments that is used singly.

Though the first through third embodiments have been described with reference to the component mounting apparatus 200, 300, and 400 of a rotary type, the component mounting methods in accordance with the first through third embodiments can be used in a component mounting apparatus of an XY-robot type in which a nozzle unit 6 having suction nozzles 5 is capable of moving freely in an XY-plane, and can restrict a change in deviation ΔL after recognition of a component.

The invention has fully been described with respect to the preferred embodiments in reference to the accompanying drawings; however, various changes and modifications are apparent to those skilled in the art. It is to be understood that such changes and modifications are embraced by the scope of the invention unless departing from the scope of the invention as defined in the appended claims.

What is claimed is:

1. A component mounting method comprising:
    causing a suction nozzle to apply a holding force to a component such that said component is sucked and held by said suction nozzle;
    recognizing a posture of said component when sucked and held by said suction nozzle;
    determining a deviation of a suction position of said component from a normal suction status of said component on basis of the recognized posture of said component, with said suction position corresponding to a position of said component on said suction nozzle when said component is sucked and held by said suction nozzle, and with said normal suction status corresponding to a reference position of said component on said suction nozzle;
    based on the determined deviation, controlling a velocity at which said suction nozzle and said component are conveyed to a component placing position; and
    at said component placing position, placing said component on a circuit-formed member.

2. The method according to claim 1, further comprising:
on basis of the determined deviation, determining a force that would be exerted on said component were said component conveyed at a set velocity after the recognition of said posture of said component, which force, if greater than a certain value, would cause said component to deviate from said suction position of said component,
such that controlling said velocity at which said suction nozzle and said component are conveyed to said component placing position comprises controlling said velocity based on a comparison between the determined force and the applied holding force.

3. The method according to claim 2, wherein
when the determined deviation is greater than a threshold value, controlling said velocity at which said suction nozzle and said component are conveyed to said component placing position comprises conveying said suction nozzle and said component at a reduced velocity, with said reduced velocity being less than said set velocity, and with said threshold value corresponding to a magnitude of deviation at which the determined force is equal to said certain value and thereby balanced with the applied holding force.

4. The method according to claim 3, wherein
said threshold value varies in accordance with properties of said component, such that controlling said velocity at which said suction nozzle and said component are conveyed to said component placing position comprises controlling said velocity in accordance with the properties of said component.

5. The method according to claim 4, wherein
said suction nozzle is one of a first nozzle and second nozzle, with said first and second nozzles being of different types relative to one another, with said first nozzle being capable of applying a first holding force, and with said second nozzle being capable of applying a second holding force that is different from said first holding force,
such that controlling said velocity at which said suction nozzle and said component are conveyed to said component placing position comprises controlling said velocity based on a comparison between the determined force and a corresponding one of said first and second holding forces.

6. The method according to claim 3, wherein
said suction nozzle is one of a first nozzle and second nozzle, with said first and second nozzles being of different types relative to one another, with said first nozzle being capable of applying a first holding force, and with said second nozzle being capable of applying a second holding force that is different from said first holding force,
such that controlling said velocity at which said suction nozzle and said component are conveyed to said component placing position comprises controlling said velocity based on a comparison between the determined force and a corresponding one of said first and second holding forces.

7. The method according to claim 3, wherein
said certain value varies in accordance with properties of said component, such that controlling said velocity at which said suction nozzle and said component are conveyed to said component placing position comprises controlling said velocity in accordance with the properties of said component.

8. The method according to claim 7, wherein
said suction nozzle is one of a first nozzle and second nozzle, with said first and second nozzles being of different types relative to one another, with said first nozzle being capable of applying a first holding force, and with said second nozzle being capable of applying a second holding force that is different from said first holding force,
such that controlling said velocity at which said suction nozzle and said component are conveyed to said component placing position comprises controlling said velocity based on a comparison between the determined force and a corresponding one of said first and second holding forces.

9. The method according to claim 2, wherein
said suction nozzle is one of a first nozzle and second nozzle, with said first and second nozzles being of different types relative to one another, with said first nozzle being capable of applying a first holding force, and with said second nozzle being capable of applying a second holding force that is different from said first holding force,
such that controlling said velocity at which said suction nozzle and said component are conveyed to said component placing position comprises controlling said velocity based on a comparison between the determined force and a corresponding one of said first and second holding forces.

10. The method according to claim 1, wherein recognizing said posture of said component when sucked and held by said suction nozzle comprises recognizing said posture at a component recognizing position, and further comprising:
after causing said suction nozzle to apply said holding force to said component such that said component is sucked and held by said suction nozzle, conveying said suction nozzle and said component at a set velocity to said component recognizing position,
wherein controlling said velocity at which said suction nozzle and said component are conveyed to said component placing position comprises conveying said suction nozzle and said component at a reduced velocity, with said reduced velocity being less than said set velocity.

11. A component mounting apparatus comprising:
a component conveying device, having a suction nozzle capable of exhibiting a holding force for sucking and holding a component to be placed on a circuit-formed member, for conveying said suction nozzle and the component, when sucked and held by said suction nozzle, at a set velocity from a component sucking position where the component is sucked by said suction nozzle to a component placing position where the component is to be placed on the circuit-formed member;
a component recognizing device for recognizing a posture of the component, when sucked and held by said suction nozzle, at a component recognizing position existing along a path through which said suction nozzle is conveyed by said component conveying device from the component sucking position to the component placing position; and
a control device for
(i) determining a deviation of a suction position of the component from a normal suction status of the component on basis of the posture of the component as recognized by said component recognizing device, with the suction position corresponding to a position of the component on said suction nozzle when the component is sucked and held by said suction nozzle, and with the normal suction status corresponding to a reference position of the component on said suction nozzle, and (ii) based on the deviation as determined by said control device, controlling a velocity at which said component conveying device conveys said suction nozzle and the component from the recognizing position toward the component placing position.

12. The component mounting apparatus according to claim 11, wherein said control device is also for (iii) on basis of the deviation as determined by said control device, determining a force to be exerted on the component resulting from conveyance of the component by said component conveying device at the set velocity after recognition of the posture of the component by said component recognizing device, which force, if greater than a certain value, would cause the component to deviate from the suction position of the component, such that said control device is for controlling the velocity at which said component conveying device conveys said suction nozzle and the component from the recognizing position toward the component placing position based on a comparison between the force as determined by said control device and the holding force exhibited by said suction nozzle.

13. The component mounting apparatus according to claim 12, wherein when the deviation as determined by said control device is greater than a threshold value, said control device is for controlling the velocity at which said component conveying device conveys said suction nozzle and the component from the recognizing position toward the component placing position by controlling said component conveying device such that said suction nozzle and the component are conveyed at an reduced velocity from the recognizing position toward the component placing position, with the reduced velocity being less than the set velocity, and with the threshold value corresponding to a magnitude of deviation at which the force as determined by said control device is equal to the certain value and thereby balanced with the holding force exhibited by said suction nozzle.

14. The component mounting apparatus according to claim 13, wherein said control device includes a component information storage section for storing information on properties of the component, with the force to be exerted on the component, resulting from conveyance of the component by said component conveying device at the set velocity, varying in accordance with the properties of the component, and said control device is also for determining the threshold value based on the information on properties of the component as read from said information storage section.

15. The component mounting apparatus according to claim 14, wherein said component conveying device has a first nozzle and a second nozzle, with said first and second nozzles being of different types relative to one another, and with said suction nozzle being one of said first and second nozzles, and said control device includes a nozzle storage section for storing information on a holding force to be exhibited by said first nozzle and a holding force to be exhibited by said second nozzle, such that said control device is for controlling the velocity at which said component conveying device conveys said suction nozzle and the component, from the recognizing position toward the component placing position, based on a comparison between the force as determined by said control device and a holding force as read from said nozzle storage section.

16. The component mounting apparatus according to claim 13, wherein said component conveying device has a first nozzle and a second nozzle, with said first and second nozzles being of different types relative to one another, and with said suction nozzle being one of said first and second nozzles, and said control device includes a nozzle storage section for storing information on a holding force to be exhibited by said first nozzle and a holding force to be exhibited by said second nozzle, such that said control device is for controlling the velocity at which said component conveying device conveys said suction nozzle and the component, from the recognizing position toward the component placing position, based on a comparison between the force as determined by said control device and a holding force as read from said nozzle storage section.

17. The component mounting apparatus according to claim 12, wherein said control device includes a component information storage section for storing information on properties of the component, with the force to be exerted on the component, resulting from conveyance of the component by said component conveying device at the set velocity, varying in accordance with the properties of the component, and said control device is also for determining the certain value based on the information on properties of the component as read from said information storage section.

18. The component mounting apparatus according to claim 17, wherein said component conveying device has a first nozzle and a second nozzle, with said first and second nozzles being of different types relative to one another, and with said suction nozzle being one of said first and second nozzles, and said control device includes a nozzle storage section for storing information on a holding force to be exhibited by said first nozzle and a holding force to be exhibited by said second nozzle, such that said control device is for controlling the velocity at which said component conveying device conveys said suction nozzle and the component, from the recognizing position toward the component placing position, based on a comparison between the force as determined by said control device and a holding force as read from said nozzle storage section.

19. The component mounting apparatus according to claim 12, wherein said component conveying device has a first nozzle and a second nozzle, with said first and second nozzles being of different types relative to one another, and with said suction nozzle being one of said first and second nozzles, and said control device includes a nozzle storage section for storing information on a holding force to be exhibited by said first nozzle and a holding force to be exhibited by said second nozzle, such that said control device is for controlling the velocity at which said component conveying device conveys said suction nozzle and the component, from the recognizing position toward the component placing position, based on a comparison between the force as determined by said control device and a holding force as read from said nozzle storage section.

20. The component mounting apparatus according to claim 11, wherein said control device is for controlling a velocity at which said component conveying device conveys said suction nozzle and the component from the recognizing position toward the component placing position by controlling said component conveying device such that said suction nozzle and the component are conveyed at an reduced velocity from the recognizing position toward the component placing position, with the reduced velocity being less than the set velocity.

* * * * *